(12) United States Patent
Ko et al.

(10) Patent No.: US 7,485,949 B2
(45) Date of Patent: Feb. 3, 2009

(54) SEMICONDUCTOR DEVICE

(75) Inventors: Chung-Chi Ko, Nantou (TW);
Chia-Cheng Chou, Keelung (TW);
Zhen-Cheng Wu, Hsinchu (TW);
Keng-Chu Lin, Pingtung (TW);
Shwang-Ming Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 91 days.

(21) Appl. No.: 11/797,310

(22) Filed: May 2, 2007

(65) Prior Publication Data
US 2008/0272493 A1 Nov. 6, 2008

(51) Int. Cl.
*H01L 23/58* (2006.01)
(52) U.S. Cl. .................. 257/646; 257/635; 257/637
(58) Field of Classification Search ............. 257/635, 257/637, 646, 758
See application file for complete search history.

(56) References Cited

U.S. PATENT DOCUMENTS 6,917,108 B2 * 7/2005 Fitzsimmons et al. ....... 257/751
7,052,932 B2 * 5/2006 Huang et al. ............... 438/105
7,135,398 B2 * 11/2006 Fitzsimmons et al. ....... 438/618
2005/0023693 A1 * 2/2005 Fitzsimmons et al. ....... 257/758

FOREIGN PATENT DOCUMENTS

JP    2005-350653 A    12/2005

* cited by examiner

*Primary Examiner*—S. V Clark
(74) *Attorney, Agent, or Firm*—Birch, Stewart, Kolasch & Birch, LLP

(57) ABSTRACT

A semiconductor device is disclosed. The device includes a substrate, a first porous SiCOH dielectric layer, a second porous SiCOH dielectric layer, and an oxide layer. The first porous SiCOH dielectric layer overlies the substrate. The second porous SiCOH dielectric layer overlies the first porous SiCOH dielectric layer. The oxide layer overlies the second porous SiCOH dielectric layer. The atomic percentage of carbon in the second porous SiCOH dielectric layer is between 16% and 22% of that in the first porous SiCOH dielectric layer.

17 Claims, 6 Drawing Sheets

SEMICONDUCTOR DEVICE

BACKGROUND OF THE INVENTION

1. Field of the Invention

The invention relates to semiconductor technology and more particularly to a metallization structure with improved reliability.

2. Description of the Related Art

As semiconductor device circuit density increases and device feature size decreases, increased numbers of patterned metal levels with decreased spacing between metal lines at each level for effectively interconnecting discrete devices on semiconductor chips are required. Layers of insulating material or film, typically referred to as inter-layer dielectric (ILD) layers, separate different levels of metal interconnections. A common insulating material used for ILD layers is silicon oxide having a dielectric constant (k) of about 4.0 to 4.5 relative to vacuum having a k value of 1.0. As the spacing between the metal lines decreases, however, the intra-level and inter-level capacitances therebetween increases, as capacitance is inversely proportional to the spacing. It is therefore desirable to minimize the dielectric constant k of the insulating material between the metal lines to reduce the RC time constant, and thus, the performance of the circuit, for example, frequency response or the like, is improved because the signal propagation time in the circuit is adversely affected by the RC delay time.

When an insulating material having a dielectric constant k less than 3, often referred to as a low k material, is utilized for ILD layers between the metal lines, the adhesion between the low k material and metal line, is weaker than that between silicon oxide and metal line. Further, the linear thermal expansion coefficient of a conventional encapsulant for a package is typically greater than 10 ppm/° C., and that of silicon, one of the popular semiconductor materials, is approximately 3 ppm/° C. Thus, high thermal expansion coefficient mismatching results in exertion of thermal stress between a chip and encapsulant in the package. When a low k material is used for the ILD layers in the chip, the ILD layers suffer from potential delamination resulting from the exertion of thermal stress during assembly.

BRIEF SUMMARY OF THE INVENTION

The invention provides semiconductor devices preventing delamination of ILD layers during packaging process.

The invention further provides a semiconductor device comprising a substrate, a first porous SiCOH dielectric layer, a second porous SiCOH dielectric layer, and an oxide layer. The first porous SiCOH dielectric layer overlies the substrate. The second porous SiCOH dielectric layer overlies the first porous SiCOH dielectric layer. The oxide layer overlies the second porous SiCOH dielectric layer. The atomic percentage of carbon in the second porous SiCOH dielectric layer is between 12% and 16% of that in the first porous SiCOH dielectric layer.

The invention further provides a metallization structure comprising a first porous SiCOH dielectric layer, a second porous SiCOH dielectric layer, and an oxide layer. The first porous SiCOH dielectric layer embeds a first metal wiring embedded therein. The second porous SiCOH dielectric layer with a second metal wiring embedded therein, overlies the first porous SiCOH dielectric layer. The oxide layer, comprising an embedded top metal wiring embedded therein, overlies the second porous SiCOH dielectric layer. The atomic percentage of carbon in the second porous SiCOH dielectric layer is between 16% and 22% of that in the first porous SiCOH dielectric layer.

The invention further provides a semiconductor package comprising a semiconductor substrate, a first porous SiCOH dielectric layer, an oxide layer, a conductive contact structure, and a package substrate. The first porous SiCOH dielectric layer with a first copper layer embedded therein overlies the semiconductor substrate. The second porous SiCOH dielectric layer with a second copper layer embedded therein overlies the first porous SiCOH dielectric layer. Atomic percentage of carbon in the second porous SiCOH dielectric layer is between 16% and 22% of that in the first porous SiCOH dielectric layer. The oxide layer with a top copper layer embedded therein overlies the second porous SiCOH dielectric layer. The conductive contact structure electrically connects the top copper layer and a package substrate. No substantially delamination occurs in the second porous SiCOH dielectric layer.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
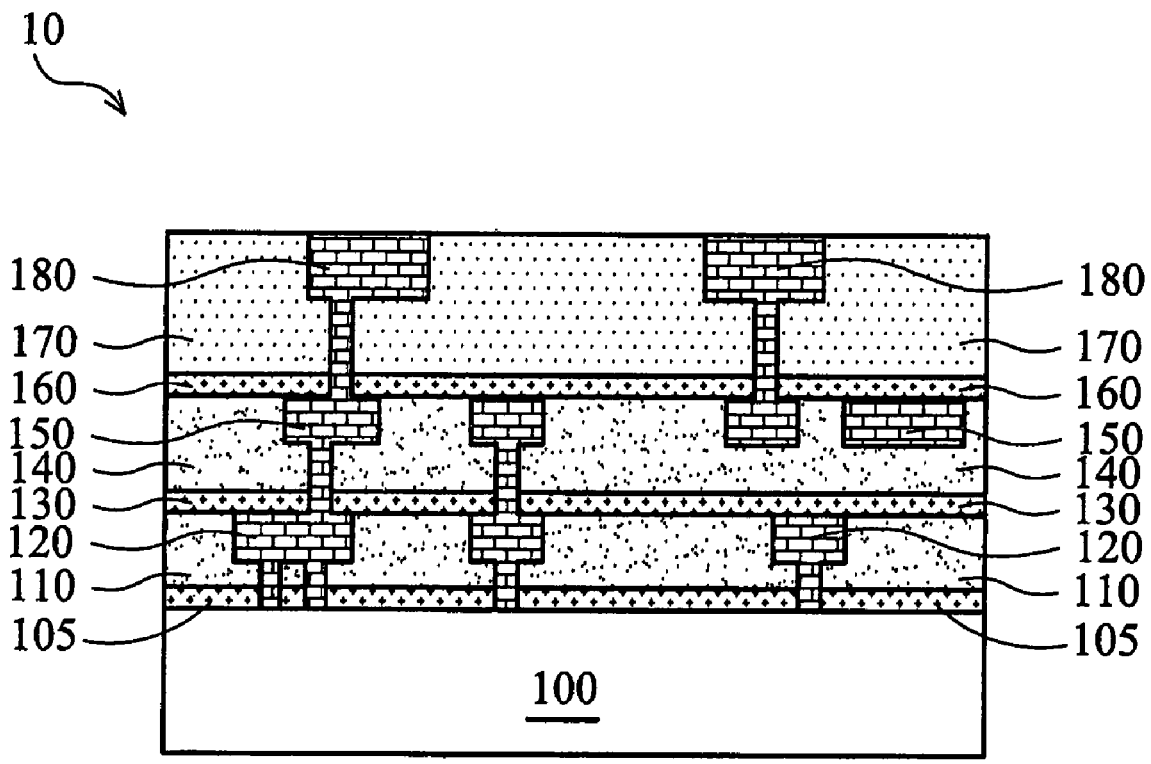
FIGS. 1A and 1B show cross-sections of a semiconductor device and package structure of a preferred embodiment of the invention.

FIG. 1A is cross-section of a semiconductor device 10 a preferred embodiment of the invention. The semiconductor device 10 comprises a substrate 100 and a metallization structure overlying the substrate 100.

The substrate 100 can comprise semiconductor materials such as silicon, germanium, silicon germanium, compound semiconductor, or other known semiconductor materials, but in this embodiment comprises silicon. The substrate 100 typically comprises active electronic devices such as transistors or diodes and the peripheral circuit thereon, which are not shown for clarity. In some cases, the substrate 100 may comprise similar interconnection layers, as subsequently described, thereon.

The metallization structure may comprise one or more interconnection layers, but in this embodiment three exemplary interconnection layers are provided. The first interconnection layer comprises a porous SiCOH dielectric layer 110 overlying the substrate 100. The term "SiCOH" means that the layer 110 comprises Si, C, O, and H atoms. A conductive layer 120 may be embedded in the porous SiCOH dielectric layer 110, acting as wiring of the first interconnection layer. The conductive layer 120 may comprise metal, nano carbon tubes, doped polycrystalline silicon, or other known conductive materials. In this embodiment, the conductive layer 120 comprises copper, such as copper lines. A barrier layer, such as tantalum nitride or titanium nitride, is preferably disposed between the conductive layer 120 and the porous SiCOH dielectric layer 110 to prevent the composition, such as copper, from diffusing into the porous SiCOH dielectric layer 110, but is not shown for clarity. In some cases, an etch stop layer 105, such as silicon nitride, silicon oxynitride, silicon carbide, or other known dielectrics, is preferably disposed between the substrate 100 and the porous SiCOH dielectric layers 110, for preventing damage to the substrate 100 during formation of the porous SiCOH dielectric layer 110 and the conductive layer 120.

The second interconnection layer comprises a porous SiCOH dielectric layer 140 overlying the porous SiCOH dielectric layer 110. A conductive layer 150 may be embedded in the porous SiCOH dielectric layer 140, acting as wiring of the second interconnection layer. The atomic percentage of carbon in the porous SiCOH dielectric layer 140 is between 16% and 22% of that in the porous SiCOH dielectric layer 110. In some embodiments, the atomic percentage of carbon in the porous SiCOH dielectric layer 140 is substantially equal to that in the porous SiCOH dielectric layer 110. The porous SiCOH dielectric layer 140 and the conductive layer 150 are similar to the porous SiCOH dielectric layer 110 and the conductive layer 120, thus further description is omitted. Further, an etch stop layer 130, such as silicon nitride, silicon oxynitride, silicon carbide, or other known dielectrics, is preferably disposed between the porous SiCOH dielectric layers 110 and 140, for preventing damage to the porous SiCOH dielectric layer 110 and the conductive layer 120 during formation of the porous SiCOH dielectric layer 140 and the conductive layer 150.

The top interconnection layer comprises an oxide layer 170 overlying the porous SiCOH dielectric layer 140. A conductive layer 180 may be embedded in the oxide layer 170, acting as wiring of the top interconnection layer. The oxide layer 170 may be any known oxide, and is preferably UV transparent for the subsequent UV treatment step. In this embodiment, the oxide layer 170 is undoped silicate glass. The conductive layer 180 is similar to the conductive layer 120, thus further description is omitted. When the conductive layer 180 comprises metal, the conductive 180 is also referred to as a top metal layer. Further, an etch stop layer 160, such as silicon nitride, silicon oxynitride, silicon carbide, or other known dielectric, is preferably disposed between the porous SiCOH dielectric layer 140 and the oxide layer 170, preventing damage to the porous SiCOH dielectric layer 140 and the conductive layer 150 during formation of the oxide layer 170 and the conductive layer 180.

Figure 1B:
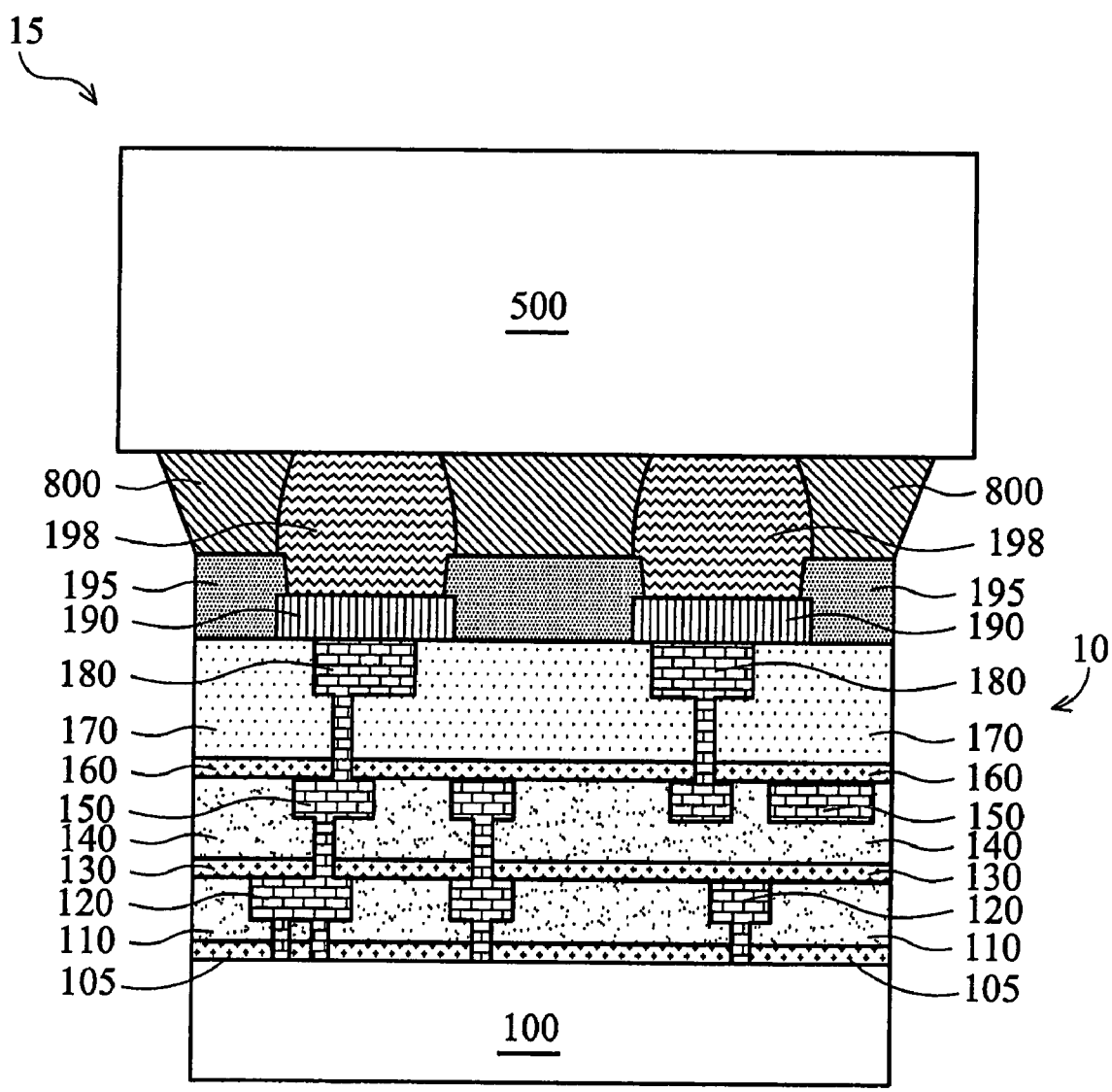

FIG. 1B shows a cross-section of a semiconductor package 15 of the semiconductor 10 shown in FIG. 1A. In this embodiment, the semiconductor device 10 electrically connects the package substrate 500 utilizing flip chip technology. In other embodiments, other packaging technologies, such as wire bonding, automatic tape bonding (TAB), or the like, can be utilized for electrical connection between the semiconductor device 10 and the package substrate 500. Regardless of the utilized packaging technology, a conductive contact structure is desired for electrically connecting the conductive layer 180 and the package substrate 500. In this embodiment, the conductive contact structure comprises a pad 190 and a bump 198. The bump 198 is replaced by a bonding wire (not shown) in wire bonding technology, and a bonding lead (not shown) in TAB technology.

The pad 190 is disposed on and electrically connected to the conductive layer 180. The pad 190 preferably comprises metals of low contact resistance, such as Al—Cu alloys. A passivation layer 195 overlying the oxide layer 170 preferably isolates each pad 190. The passivation layer 195 comprises an opening exposing the pad 190. The passivation layer may comprise silicon nitride, polyimide, or other known dielectrics for further protecting the semiconductor device 10 from humidity, ingress of particles, or other environmental contaminants. One or more under bump metallurgy (UBM) layers are preferably disposed on the pad 190 for increasing adhesion between the pad 190 and a bump 198, but are not shown for clarity. The bump 198 may comprise conductive polymers, gold, copper, solder, or other known conductive materials for electrical connection between the pad 190 and the package substrate 800. In this embodiment, an underfill material 800 is disposed in the gap between the semiconductor device 10 and the package substrate 500 around the bump 198 serving as a buffer for the mismatch of thermal expansion coefficients between the semiconductor device 10 and the package substrate 500.

FIGS. 2A through 2D are cross-sections of exemplary processing steps of the semiconductor device 10 shown in FIG. 1A.

Figure 2A:
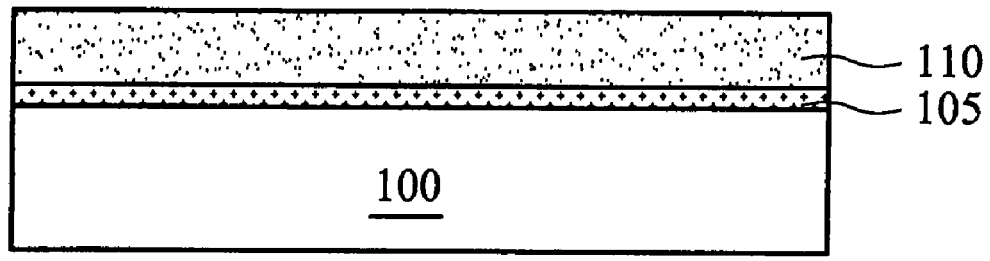
FIGS. 2A through 2D show cross-sections of exemplary processing steps of the semiconductor device shown in FIG. 1A.

In FIG. 2A, the substrate 100 is provided. The porous SiCOH dielectric layer 110 is formed overlying the substrate 100 by a method such as plasma enhanced chemical vapor deposition (PECVD), high density plasma deposition, pulsed PECVD, spin coating, or other method. When desired, the etch stop layer 105 is formed overlying the substrate 100 prior to the formation of the porous SiCOH dielectric layer 110. The porous SiCOH dielectric layer 110 is then exposed to UV radiation for removing porogen therefrom and leaving a large number of voids therein making the layer porous. Simultaneously, some of the carbon-to-carbon bonds and/or carbon-to-silicon bonds in the porous SiCOH dielectric layer 110 may be broken by energy from the UV radiation. Some carbon atoms may leave the porous SiCOH dielectric layer 110 during exposure to UV radiation, and thus, the carbon content in the porous SiCOH dielectric layer 110 decreases during the UV exposure. In some embodiments, the UV radiation can be replaced by other forms of radiation, such as X-Rays, electron beams, or others. In other embodiments, the porous SiCOH dielectric layer 110 is thermally treated rather than exposed to radiation.

Figure 2B:
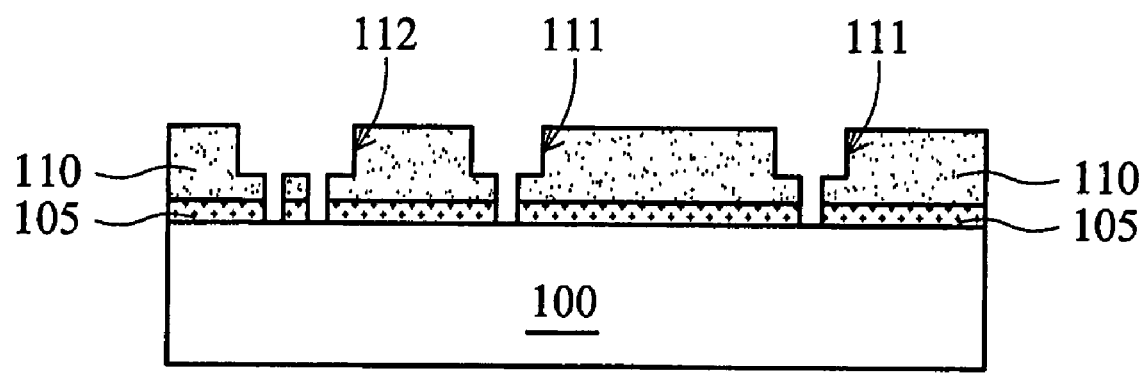

In FIG. 2B, the porous SiCOH dielectric layer 110 is patterned, forming openings 111 and 112 therein. In this embodiment, the openings 111 and 112 are dual damascene openings, and each comprises a trench and at least one underlying via. In other embodiments, the openings 111 and 112 can be single damascene openings or other types of openings.

Figure 2C:
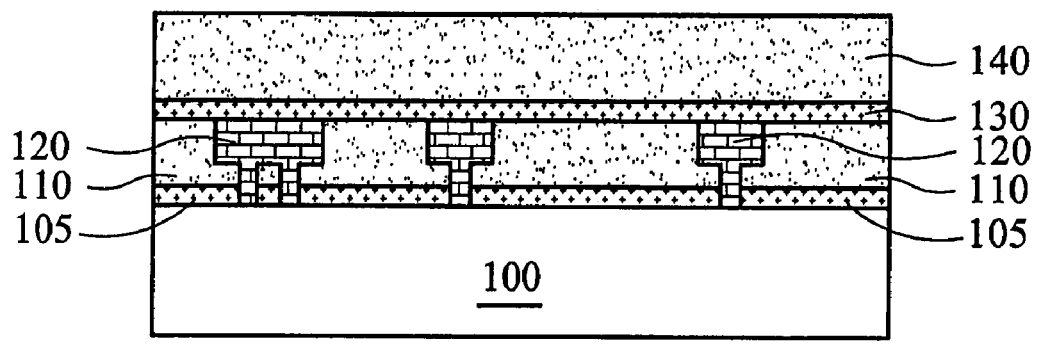

In FIG. 2C, a conductive material is filled in the openings 111 and 112, completing the conductive layer 120 embedded in the porous SiCOH dielectric layer 110. The conductive layer 120 can be formed by a method such as electroplating, electroless plating, chemical vapor deposition, physical vapor deposition, or a combination thereof. After formation, an etching back or planarization step can be performed to remove the conductive material beyond the openings 111 and 112. When desired, the etch stop layer 130 is formed overlying the porous SiCOH dielectric layer 110 and the conductive layer 120. The conductive layer 120 may electrically connect the active devices or peripheral circuits of the substrate 100. When the substrate 100 comprises other interconnection layers, such as the ones similar to the structure of the porous SiCOH dielectric layer 110 and the conductive layer 120, the conductive layer 120 may electrically connect the interconnection layers.

Figure 2D:
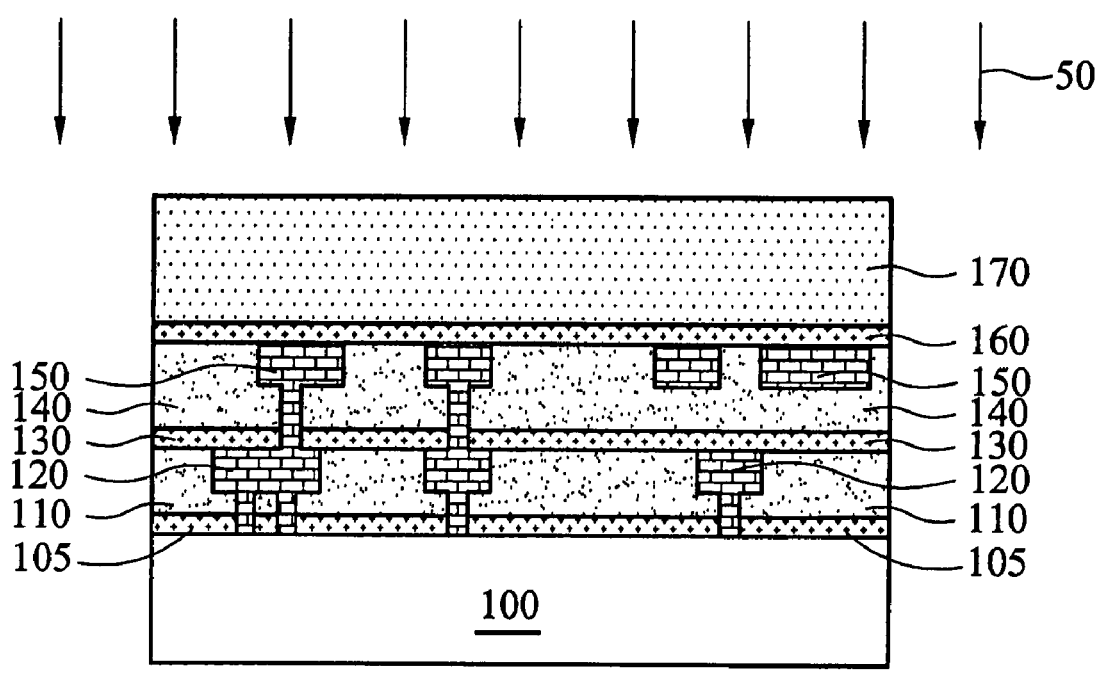

In FIG. 2D, a process to that forming the porous SiCOH dielectric layer 110 and conductive layer 120 can be performed to complete the porous SiCOH dielectric layer 140 and the embedded conductive layer 150 overlying the porous SiCOH dielectric layer 110 and the conductive layer 120. The conductive layer 150 electrically connects the underlying conductive layer 120. When the porous SiCOH dielectric layer 140 and the etch stop layer 130 are UV transparent, the underlying porous SiCOH dielectric layer 110 is indirectly exposed to UV radiation for treating the porous SiCOH dielectric layer 140. Thus, the adhesion among the porous SiCOH dielectric layer 110, the conductive layer 120, and the etch stop layer 130 is enhanced by the UV radiation for treating the porous SiCOH dielectric layer 140.

In FIG. 2D, the etch stop layer 160 is formed overlying the porous SiCOH dielectric layer 140 and the conductive layer 150 when desired. Next, the oxide layer 170 is formed overlying the etch stop layer 160 by a method such as chemical vapor deposition or spin coating. The oxide layer 170 is then exposed to UV radiation 50. The power of UV radiation 50 is preferably between 1000 and 8000 W. The wavelength of UV radiation 50 is preferably between 200 and 400 nm. The temperature of the semiconductor device 10 during UV exposure is preferably between 200 and 450° C. The oxide layer 170 is preferably UV transparent, and thus, the underlying porous SiCOH dielectric layer 140 is simultaneously indirectly exposed to UV radiation 50. The adhesion among the porous SiCOH dielectric layer 140, the conductive layer 150, and the etch stop layer 160 is enhanced by the UV radiation 50. Moreover, the indirect exposure from the UV radiation 50 also decreases the carbon content in the porous SiCOH dielectric layer 140. As a result, the atomic percentage of carbon in the porous SiCOH dielectric layer 140 can be between 12% and 16% of that of porous SiCOH dielectric layer 110. In some embodiments, the UV radiation 50 may be replaced by other radiation, such as X-Rays or electron beams.

After UV exposure, a process similar to that for forming the conductive layer 120 can be performed to embed the conductive layer 180 in the oxide layer 170. Materials for the pad 190 and the passivation layer 195 are then formed and patterned respectively, followed by packaging the semiconductor device 10 utilizing flip chip technology to complete the semiconductor package 15 shown in FIG. 1B. It is appreciated that the UV exposure to the oxide layer simultaneously enhances the adhesion among the porous SiCOH dielectric layer 140, the conductive layer 150, and the etch stop layer 160, no substantial delamination occurs in the porous SiCOH dielectric layer 140. For example, interfaces between the porous SiCOH dielectric layer 140, the conductive layer 150, and the etch stop layer 160 are substantially free of cracks and delamination.

In some embodiments, the oxide layer 170 may be exposed to UV radiation 50 after formation of the openings for the conductive layer 180. In some embodiments, the oxide layer 170 may be exposed to UV radiation 50 after formation of the conductive layer 180. The conductive layer 180, however, is not UV transparent and thus blocks some of the UV radiation 50. Thus, the oxide layer 170 is preferably exposed to UV radiation prior to formation of the conductive layer 180.

Figure 3A:
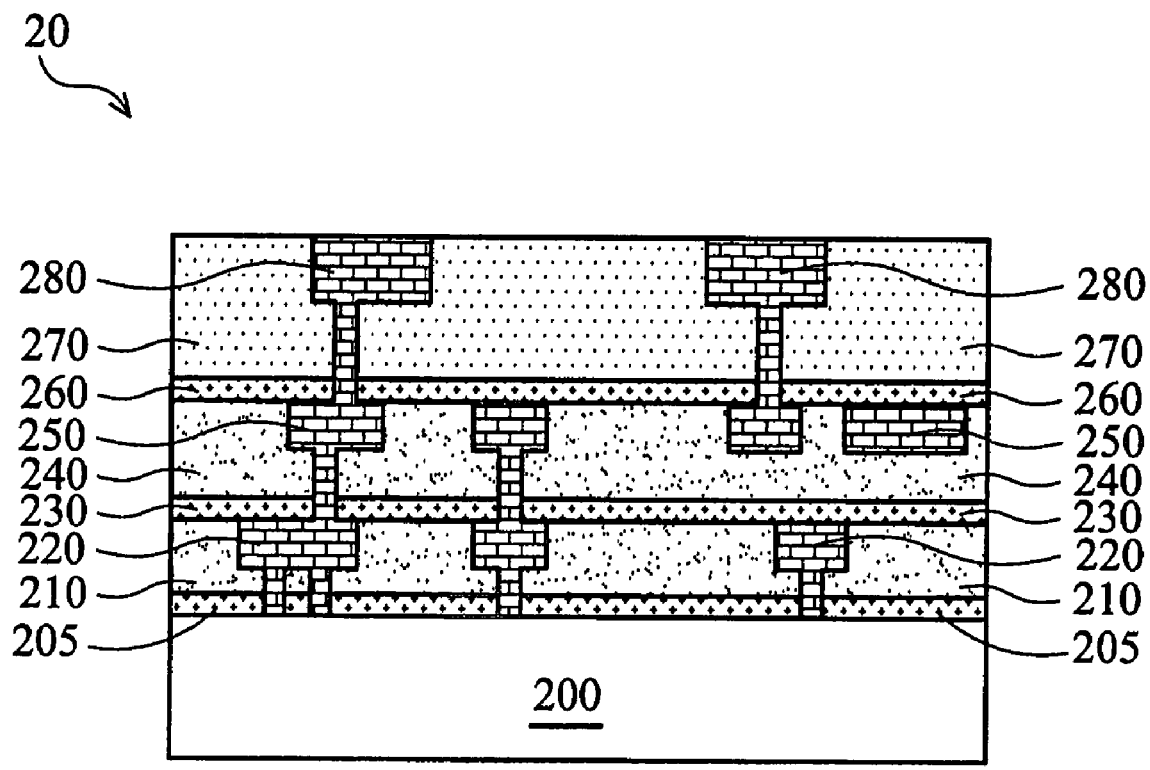
FIGS. 3A and 3B show cross-sections of a semiconductor device and package structure of a comparative example.
Figure 3B:
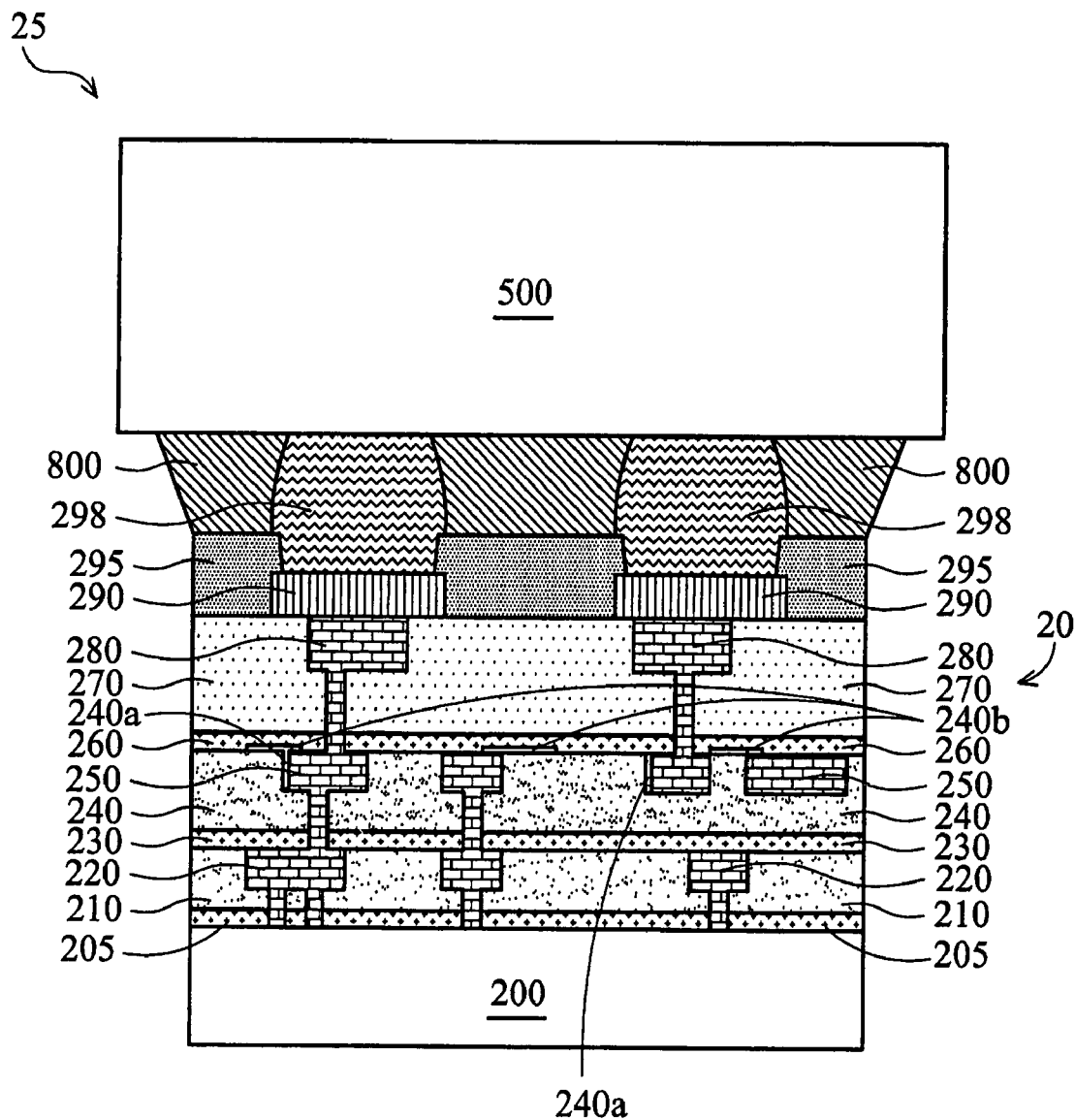

FIGS. 3A and 3B show cross-sections of a semiconductor device 20 and a semiconductor package 25 of a comparative example relative to the semiconductor device 10 and the semiconductor package 15 shown in FIGS. 1A and 1B.

In FIG. 3A, materials and processing steps for substrate 100 and the layers 205 and 210 through 280 overlying the substrate 200 are almost equivalent with those for the respective substrate 100 and layers 105 and 110 through 180 overlying the substrate 100 shown in FIG. 1A, in addition no UV exposure is performed on the oxide layer 270. Thus, the adhesion among the porous SiCOH dielectric layer 240, the conductive layer 250, and the etch stop layer 260 cannot be enhanced, and atomic percentage of carbon in the porous SiCOH dielectric layer 240 is between 1.15 and 1.25 times higher than that in the porous SiCOH dielectric layer 210.

When the semiconductor device 20 shown in FIG. 3A is packaged in the semiconductor package 25 shown in FIG. 3B, cracks 240a and 240b may potentially occur delaminating the interfaces between the porous SiCOH dielectric layer 240, the conductive layer 250, and the etch stop layer 260, due to inadequate adhesion.

As described, the efficacy of the inventive semiconductor device and process for the same provide enhanced adhesion between layers and components in the interconnection structure thereof, improving process yield and product reliability.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate;
a first porous SiCOH dielectric layer overlying the substrate;
a second porous SiCOH dielectric layer overlying the first porous SiCOH dielectric layer; and
an oxide layer overlying the second porous SiCOH dielectric layer; wherein the atomic percentage of carbon in the second porous SiCOH dielectric layer is between 16% and 22% of that in the first porous SiCOH dielectric layer.

2. The device as claimed in claim 1, wherein the oxide layer comprises undoped silicate glass (USG).

3. The device as claimed in claim 1, further comprising:
a first etch stop layer between the first and second porous SiCOH dielectric layers; and
a second etch stop layer between the second porous SiCOH dielectric layer and the oxide layer.

4. The device as claimed in claim 1, further comprising:
a first conductive layer embedded in the first porous SiCOH dielectric layer;
a second conductive layer embedded in the second porous SiCOH dielectric layer; and
a top conductive layer embedded in the oxide layer.

5. The device as claimed in claim 4, wherein the first, second, and top conductive layers comprise copper.

6. The device as claimed in claim 1, wherein
the oxide layer is UV transparent; and
the oxide layer is exposed to UV radiation after formation thereof.

7. The device as claimed in claim 6, the condition of the UV exposure comprising:
power of the UV radiation between 1000 and 8000 W;

wavelength of the UV radiation between 200 and 400 nm; and temperature of the semiconductor device during the UV exposure between 200 and 450° C.

8. A metallization structure, comprising:
a first porous SiCOH dielectric layer having a first metal wiring embedded therein;
a second porous SiCOH dielectric layer with a second metal wiring embedded therein, overlying the first porous SiCOH dielectric layer; and
an oxide layer having a top metal wiring embedded therein, overlying the second porous SiCOH dielectric layer; wherein
atomic percentage of carbon in the second porous SiCOH dielectric layer is between 16% and 22% of that in the first porous SiCOH dielectric layer.

9. The structure as claimed in claim 8, wherein the oxide layer comprises undoped silicate glass (USG).

10. The structure as claimed in claim 8, further comprising:
a first etch stop layer between the first and second porous SiCOH dielectric layers; and
a second etch stop layer between the second porous SiCOH dielectric layer and the oxide layer.

11. The structure as claimed in claim 8, wherein the first, second, and top metal wirings comprise copper.

12. The structure as claimed in claim 8, wherein
the oxide layer is UV transparent; and
the oxide layer is exposed to UV radiation after formation thereof.

13. The structure as claimed in claim 8, wherein the condition of the UV exposure comprises:
power of the UV radiation being between 1000 and 8000 W;
wave length of the UV radiation being between 200 and 400 nm; and
temperature of the semiconductor device during the UV exposure between 200 and 450° C.

14. A semiconductor package, comprising:
a semiconductor substrate;
a first porous SiCOH dielectric layer having a first copper layer embedded therein overlying the semiconductor substrate;
a second porous SiCOH dielectric layer having a second copper layer embedded therein overlying the first porous SiCOH dielectric layer, wherein the atomic percentage of carbon in the second porous SiCOH dielectric layer is between 16% and 22% of that in the first porous SiCOH dielectric layer;
an oxide layer having a top copper layer embedded therein overlying the second porous SiCOH dielectric layer; and
a conductive contact structure electrically connecting the top copper layer and a package substrate; wherein
no substantial delamination occurs in the second porous SiCOH dielectric layer.

15. The package as claimed in claim 14, wherein the oxide layer comprises undoped silicate glass (USG).

16. The package as claimed in claim 14, further comprising:
a first etch stop layer between the first and second porous SiCOH dielectric layers; and
a second etch stop layer between the second porous SiCOH dielectric layer and the oxide layer.

17. The package as claimed in claim 14, wherein
the oxide layer is UV transparent; and
the oxide layer is exposed to UV radiation after formation thereof under the condition comprising:
power of the UV radiation between 1000 and 8000 W;
wavelength of the UV radiation between 200 and 400 nm; and
temperature of the semiconductor device during the UV exposure between 200 and 450° C.

* * * * *